(12) United States Patent
Li

(10) Patent No.: US 11,404,668 B2
(45) Date of Patent: Aug. 2, 2022

(54) ORGANIC LIGHT EMITTING DIODE DISPLAY PANEL HAVING GROOVE STRUCTURE IN THIN FILM PACKAGING LAYER TO IMPROVE ADHESION AND METHOD OF MANUFACTURING THEREOF

(71) Applicant: Wuhan China Star Optoelectronics Semiconductor Display Technology Co., Ltd., Hubei (CN)

(72) Inventor: Zhao Li, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 366 days.

(21) Appl. No.: 16/623,496

(22) PCT Filed: Oct. 18, 2019

(86) PCT No.: PCT/CN2019/111861
§ 371 (c)(1),
(2) Date: Dec. 17, 2019

(87) PCT Pub. No.: WO2021/031322
PCT Pub. Date: Feb. 25, 2021

(65) Prior Publication Data
US 2021/0367206 A1 Nov. 25, 2021

(30) Foreign Application Priority Data
Aug. 19, 2019 (CN) .......................... 201910765657.X

(51) Int. Cl.
*H01L 51/52* (2006.01)
*H01L 27/32* (2006.01)
*H01L 51/56* (2006.01)

(52) U.S. Cl.
CPC ...... *H01L 51/5253* (2013.01); *H01L 27/3244* (2013.01); *H01L 51/56* (2013.01); *H01L 2227/323* (2013.01)

(58) Field of Classification Search
CPC ...................... H01L 51/5253; H01L 27/3244
See application file for complete search history.

(56) References Cited

U.S. PATENT DOCUMENTS

2012/0256202 A1  10/2012  Lee
2013/0161680 A1* 6/2013  Oh ..................... H01L 51/5256
                                                                    438/46

(Continued)

FOREIGN PATENT DOCUMENTS

CN    104641485 A    5/2015
CN    108878680 A    11/2018

(Continued)

*Primary Examiner* — Michael Jung
(74) *Attorney, Agent, or Firm* — Taft Stettinius & Hollister LLP

(57) ABSTRACT

An organic light emitting diode (OLED) display panel and a method of manufacturing the same are provided. The OLED display panel includes a base substrate, a thin film transistor layer, an OLED device layer and a packaging layer sequentially disposed. The packaging layer includes a first inorganic packaging layer, a first organic layer and a second inorganic packaging layer sequentially disposed. The first inorganic packaging layer is formed with a first groove and the first organic packaging layer is formed with a second groove.

13 Claims, 6 Drawing Sheets

(56) References Cited

U.S. PATENT DOCUMENTS

| | | | |
|---|---|---|---|
| 2015/0207101 A1 | 7/2015 | Lang et al. | |
| 2016/0322601 A1* | 11/2016 | Lee | H01L 51/5256 |
| 2018/0076417 A1* | 3/2018 | Song | H01L 51/5253 |
| 2018/0233701 A1* | 8/2018 | Li | H01L 51/5256 |
| 2019/0363142 A1* | 11/2019 | Tanaka | H01L 51/56 |

FOREIGN PATENT DOCUMENTS

| | | | |
|---|---|---|---|
| CN | 109273507 A | 1/2019 |
| CN | 109461824 A | 3/2019 |
| CN | 106328826 B | 4/2019 |

\* cited by examiner

ORGANIC LIGHT EMITTING DIODE DISPLAY PANEL HAVING GROOVE STRUCTURE IN THIN FILM PACKAGING LAYER TO IMPROVE ADHESION AND METHOD OF MANUFACTURING THEREOF

CROSS-REFERENCE TO RELATED APPLICATIONS

This application is a U.S. National Phase of International PCT Application No. PCT/CN2019/111861 filed Oct. 18, 2019, which claims the benefit of Chinese Patent Application Serial No. 201910765657.X filed Aug. 19, 2019, the contents of each application are incorporated herein by reference in their entirety.

BACKGROUND OF INVENTION

Field of Invention

The present invention relates to the field of display, and more particularly, to an organic light emitting diode (OLED) display panel and a method of manufacturing the same.

Description of Prior Art

Recently, organic light emitting diode (OLED) display technology has developed by leaps and bounds. OLED products have attracted more and more attention and applications due to their advantages of lightness, fast responses, wide viewing angles, high contrast and flexibility, and mainly used in display fields such as mobile phones, tablets and televisions.

An OLED display panel includes a base layer, a thin film transistor (TFT) layer, a driving layer, an OLED emitting layer, and a packaging layer sequentially disposed from bottom to top. The packaging layer includes an "inorganic layer-organic layer-inorganic layer" alternating structure to block water-oxygen transmission and prevent the OLED device from degradation due to the invasion of external water, oxygen, impurities, and the like. In the field of flexible OLED display, the OLED display panel is required to have good bending ability, that is, the OLED display panel can maintain good display performance without fast degradation when bending. Therefore, this requires strong adhesion between the packaging layers, better internal stress releasing ability of the packaging film so as to prevent the film layers from peeling while the bending occurs, thereby effectively avoiding the external water oxygen and impurities invade from the peeling point to the inner film layer of the display panel that causes the OLED display panel to be oxidized and failed.

However, in a conventional thin film package, due to interface of the organic layer and the inorganic layer are generally flat and smooth, and due to the organic layer and the inorganic layer are different in material, when the bending or lateral stress is applied, it is easy to be misaligned or peeled off, so that external water, oxygen, impurities, and the like invade the inner film layer may affect the quality of the inner film layer.

Therefore, in the conventional OLED display technology, stability and adhesion between the inorganic layer and the organic layer of the thin film packaging structure are poor, so that the inner film layer is easily affected by external water, oxygen, and impurities, and thus the problems of affecting the quality of the display panel are in urgent need of improvement.

SUMMARY OF INVENTION

The present invention relates to an organic light emitting diode (OLED) display panel and a method of manufacturing the same, which are used to solve the problem of poor stability and adhesion between an inorganic layer and an organic layer of a thin film packaging structure in the prior art that makes the inner film layer is easy to affected by the external water, oxygen and impurities degrading the quality of the display panel To solve the above problems, the technical solutions provided by the present invention are described as follows:

an OLED display panel provided by the present invention includes a base substrate, a thin film transistor (TFT) layer, an OLED device layer, and a packaging layer sequentially disposed. The packaging layer includes a first inorganic packaging layer, an organic packaging layer and a second inorganic packaging layer sequentially disposed. The first inorganic packaging layer is formed with a first groove on a side in contact with the first organic packaging layer. The first organic packaging layer is formed with a second groove on a side in contact with the second inorganic packaging layer. The film thickness of the first inorganic packaging layer is the same as the film thickness of the second inorganic packaging layer.

According to one embodiment of the present invention, the packaging layer further includes a second organic packaging layer and a third inorganic packaging layer sequentially disposed on the second inorganic packaging layer. The second inorganic packaging layer is formed with a third groove on a side in contact with the second organic packaging layer. The second organic packaging layer is formed with a fourth groove on a side in contact with the third inorganic packaging layer.

According to one embodiment of the present invention, the first groove and the third groove are formed the same, the second groove and the fourth groove are formed the same.

According to one embodiment of the present invention, the first groove is uniformly arranged as an array on a side of the first inorganic packaging layer near the first organic packaging layer; the second groove is uniformly arranged on a side of the first organic packaging layer near the second inorganic packaging layer.

According to one embodiment of the present invention, the first groove and the second groove have a predetermined length of 5 to 10 μm, and the predetermined spacing is 10 to 20 μm; the predetermined depth of the first groove is 0 to 0.5 μm, and the predetermined depth of the second groove is 0 to 1 μm.

According to one embodiment of by the present invention, the shape of the first groove and the second groove is rectangular, semi-circular, inverted triangle, trapezoidal, J-shaped or crescent-shaped or any one or more in combination.

According to one embodiment of the present invention, the first inorganic packaging layer and the second inorganic packaging layer have a predetermined thickness of 1 to 2 μm; and the first organic packaging layer has a predetermined thickness of 6 to 12 μm.

According to one embodiment of the present invention, the first inorganic packaging layer and the second inorganic packaging layer are made of the same material as silicon nitride; the first organic packaging layer is made of polymethyl methacrylate.

According to one embodiment of the present invention, the base substrate is a rigid substrate, a flexible substrate, or is coated on a glass substrate by polyimide coating.

According to one embodiment of the present invention, the thin film transistor layer is a top gate thin film transistor or a bottom gate thin film transistor.

According to one embodiment of the present invention, the cathode layer of the OLED device layer is made of a material having a low work function.

The present invention further provides an OLED display panel, comprising a base substrate, a TFT layer, an OLED device layer, and a packaging layer sequentially disposed. The packaging layer includes a first inorganic packaging layer, an organic packaging layer, and a second inorganic packaging layer sequentially disposed. The first inorganic packaging layer is formed with a first groove on a side in contact with the first organic packaging layer. The first organic packaging layer is formed with a second groove on a side in contact with the second inorganic packaging layer.

According to one embodiment of the present invention, the packaging layer further includes a second organic packaging layer and a third inorganic packaging layer sequentially disposed on the second inorganic packaging layer. The second inorganic packaging layer is formed with a third groove on a side in contact with the second organic packaging layer. The second organic packaging layer is formed with a fourth groove on a side in contact with the third inorganic packaging layer.

According to one embodiment of the present invention, the first groove and the third groove are formed the same, the second groove and the fourth groove are formed the same.

According to one embodiment of the present invention, the first groove is uniformly arranged in a side of the first inorganic packaging layer in contact with the first organic packaging layer; the second groove is uniformly arranged in a side of the first organic packaging layer in contact with the second inorganic packaging layer.

According to one embodiment of the present invention, the first groove and the second groove have a predetermined length of 5 to 10 μm, and a predetermined spacing of 10 to 20 μm; the predetermined depth of the first groove is 0 to 0.5 μm, and the predetermined depth of the second groove is 0 to 1 μm.

The present invention also provides a method of manufacturing an OLED display panel, which includes following steps:

S10, providing a base substrate;

S20, sequentially disposing a TFT layer and an OLED device layer on the base substrate;

S30, depositing a first inorganic packaging layer on a side of the OLED device layer away from the TFT layer, and forming a first groove on a side of the first inorganic packaging layer away from the OLED device layer by using a first mask;

S40, depositing a first organic packaging layer on a side of the first inorganic packaging layer formed with a first groove, and forming a second groove on a side of the first organic packaging layer away from the first inorganic packaging layer by using a second mask; and S50, disposing a second inorganic packaging layer on a side of the first organic packaging layer formed with the second groove.

According to one embodiment of the present invention, the method further includes:

S60, forming a third groove on a side of the second inorganic packaging layer away from the first organic packaging layer by using the first mask;

S70, depositing a second organic packaging layer on a side of the second inorganic packaging layer formed with a third groove, and forming a fourth groove on a side of the second inorganic packaging layer away from the second inorganic packaging layer by using the second mask; and S80, disposing a third inorganic packaging layer on a side of the second organic packaging layer formed with the fourth groove.

According to one embodiment of the present invention, the shape of the first mask is different from the shape of the second mask.

According to one embodiment of the present invention, the first organic packaging layer and the second organic packaging layer are both prepared by a method of inkjet printing, and the first inorganic packaging layer and the second inorganic packaging layer are deposited by method of chemical vapor deposition.

Compared with the prior art, an OLED display panel provided by the present invention has following beneficial effects:

1. First, the OLED display panel provided by the present invention provides a groove structure in the thin film packaging layer to improve adhesion and stability of the inorganic packaging layer and the first organic packaging layer, so that when the display panel is bending or subjected to lateral pressure, it is not easy to peel, and the inner film layer is better protected from external water, oxygen, impurities, etc., and the quality of the display panel is improved.

2. Second, the groove is divided into the first groove and second groove according to the different thickness of the inorganic packaging layer and the first organic packaging layer. There is a certain difference in the depth of the first groove and the second groove, which further improves the stability of the film package.

3. In order to fix the groove, the first protrusion and the second protrusion are formed on the side of the first organic packaging layer and the second inorganic packaging layer near the base substrate, respectively.

4. Finally, the OLED display panel provided by the present invention has a packaging layer with the structure of: "first inorganic packaging layer-first organic packaging layer-second inorganic packing layer," "first inorganic packaging layer-first organic packaging layer-second inorganic packaging layer-second organic packaging layer-third inorganic packaging layer," or "first inorganic packaging layer-first organic packaging layer-second inorganic packaging layer-second organic packaging layer-third inorganic packaging layer-third organic packaging layer-fourth inorganic packaging layer," which is constructed with multi-layer packaging structure, and thus it reduces the risk of peeling in the thin film packaging layer of the OLED display panel.

BRIEF DESCRIPTION OF DRAWINGS

In order to more clearly illustrate the technical solutions in the embodiments of the present invention, the drawings used in the description of the embodiments will be briefly described below. It is obvious that the drawings in the following description are only some embodiments of the present invention. Other drawings can also be obtained from those skilled in the art based on these drawings without paying any creative effort.

DETAILED DESCRIPTION OF PREFERRED EMBODIMENTS

Figure 1:
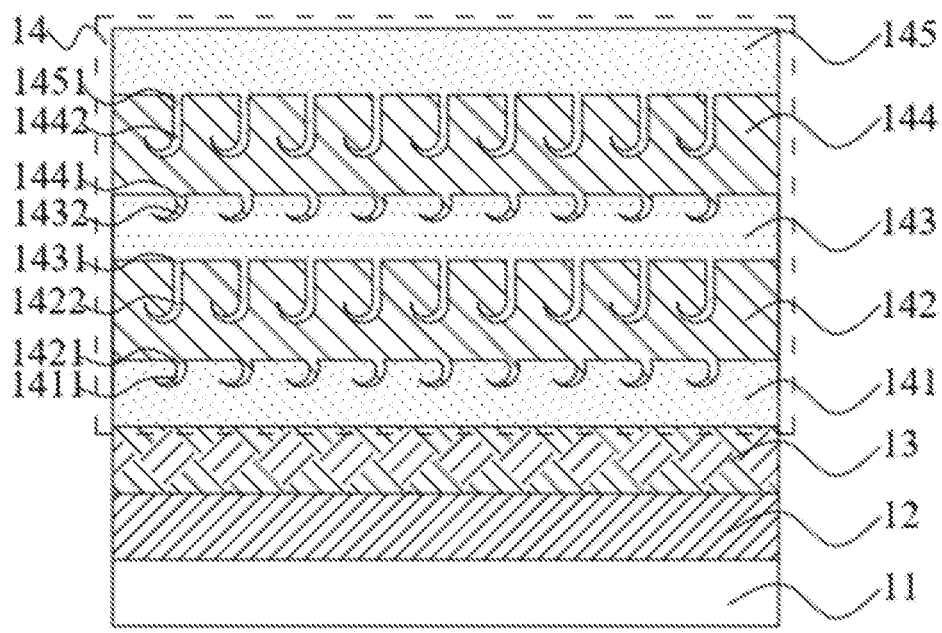
FIG. 1 is a schematic diagram of a first structure of an OLED display panel according to one embodiment of the present invention.
Figure 2A:
FIG. 2A to FIG. 2I are diagrams showing a manufacturing process of an OLED display panel according to one embodiment of the present invention.
Figure 2B:
Figure 2C:
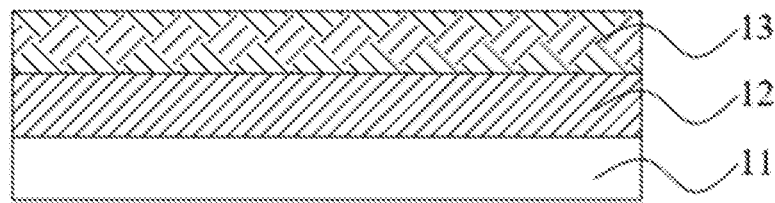
Figure 2D:
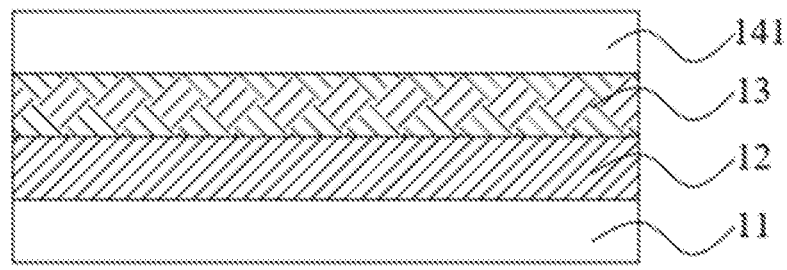
Figure 2E:
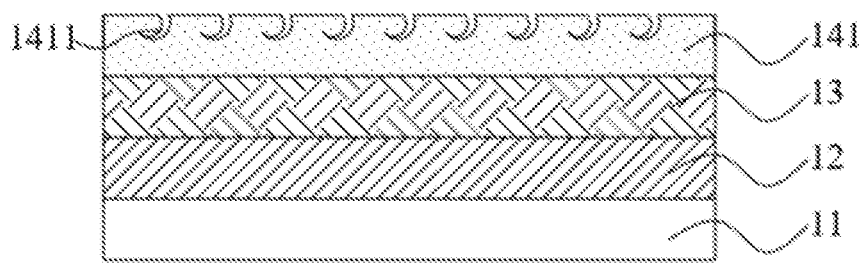
Figure 2F:
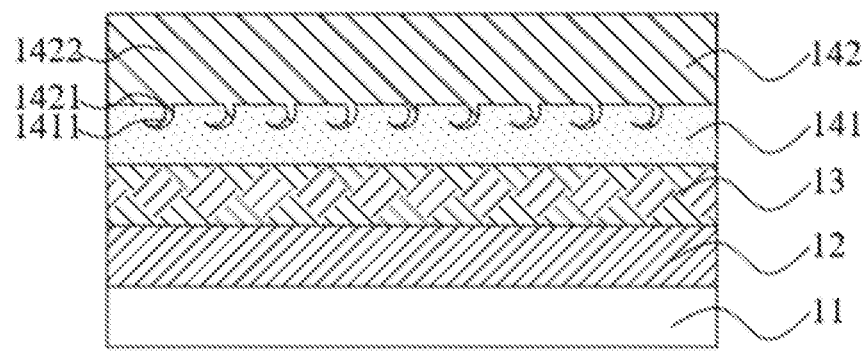
Figure 2G:
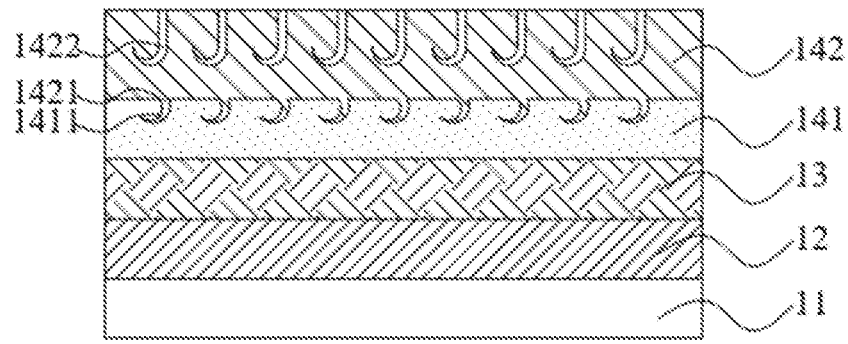
Figure 2H:
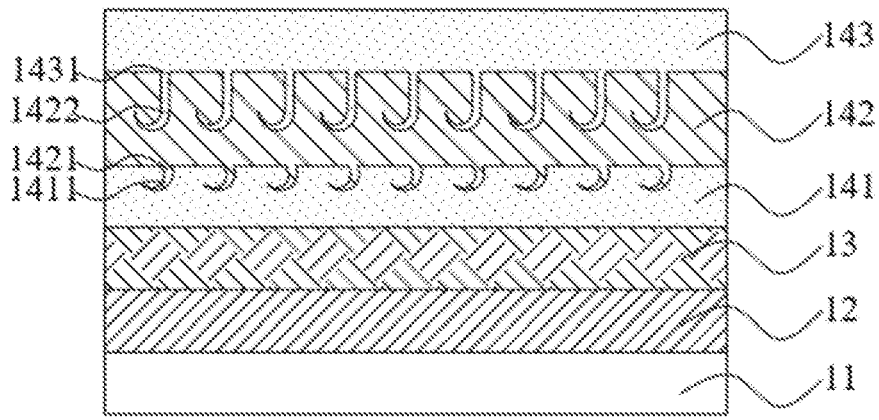
Figure 2I:
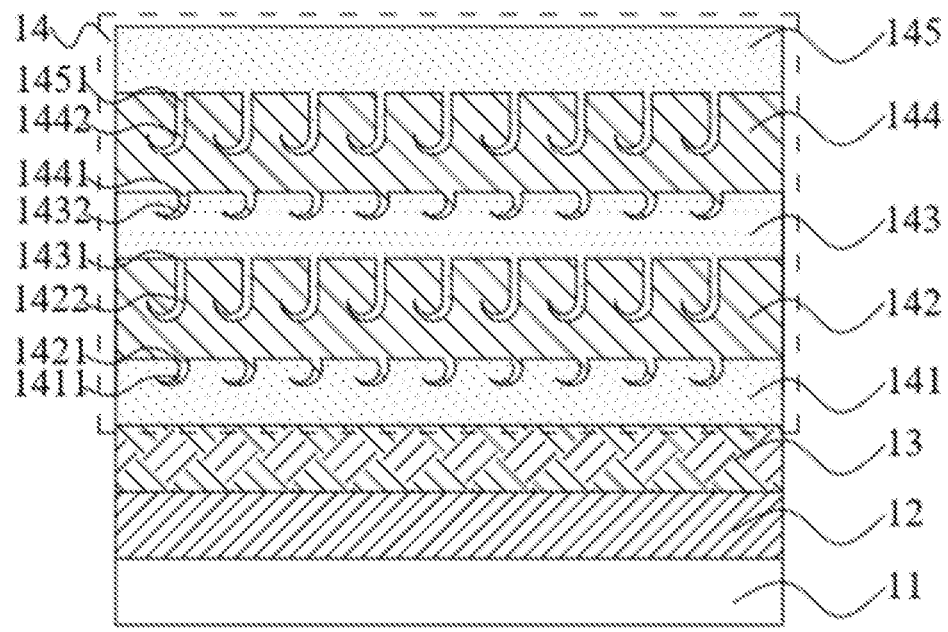

The preferred embodiments of the present invention are described in detail below with reference to the accompanying drawings. Those skilled persons in the art will easily understand how to implement the invention. The invention can be implemented by the embodiments, so that the technical content of the disclosure will be clear, so that those skilled persons in the art will understand how to implement the invention. The present invention may be accomplished in many different embodiments, and the scope of the invention is not limited to the embodiments described herein.

In the description of the present invention, it should be understood that the terms "center," "longitudinal," "transverse," "length," "width," "thickness," "upper," "lower," "front," "back," "left," "right," "vertical," "horizontal," "top," "bottom," "inside," "outside," "clockwise," "counterclockwise," etc. The positional relationship is based on the orientation or positional relationship shown in the drawings, and is merely for the convenience of describing the present invention and the simplified description, and does not indicate or imply that the device or component referred to has a specific orientation, and is constructed and operated in a specific orientation. Therefore, it should not be construed as limiting the present invention.

Moreover, the terms "first" and "second" are used for descriptive purposes only and are not to be construed as indicating or implying a relative importance or implicitly indicating the number of technical features. Thus, features defining "first" or "second" may include one or more of the described features either explicitly or implicitly. In the description of the present invention, the meaning of "a plurality" is two or more unless specifically defined otherwise.

The present invention provides an organic light emitting diode (OLED) display panel and a method of manufacturing the same, as shown in FIG. 1 to FIG. 5, specifically.

Figure 3:
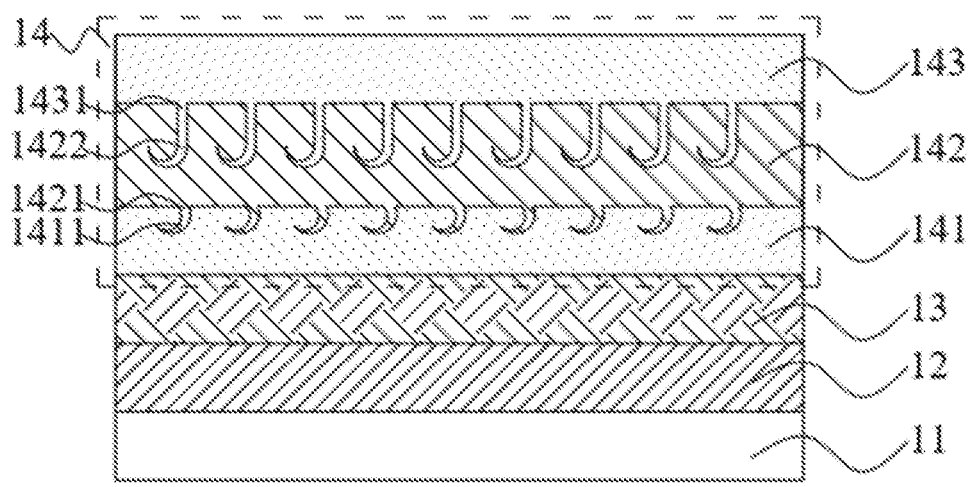
FIG. 3 is a schematic diagram of a second structure of an OLED display panel according to one embodiment of the present invention.
Figure 4:
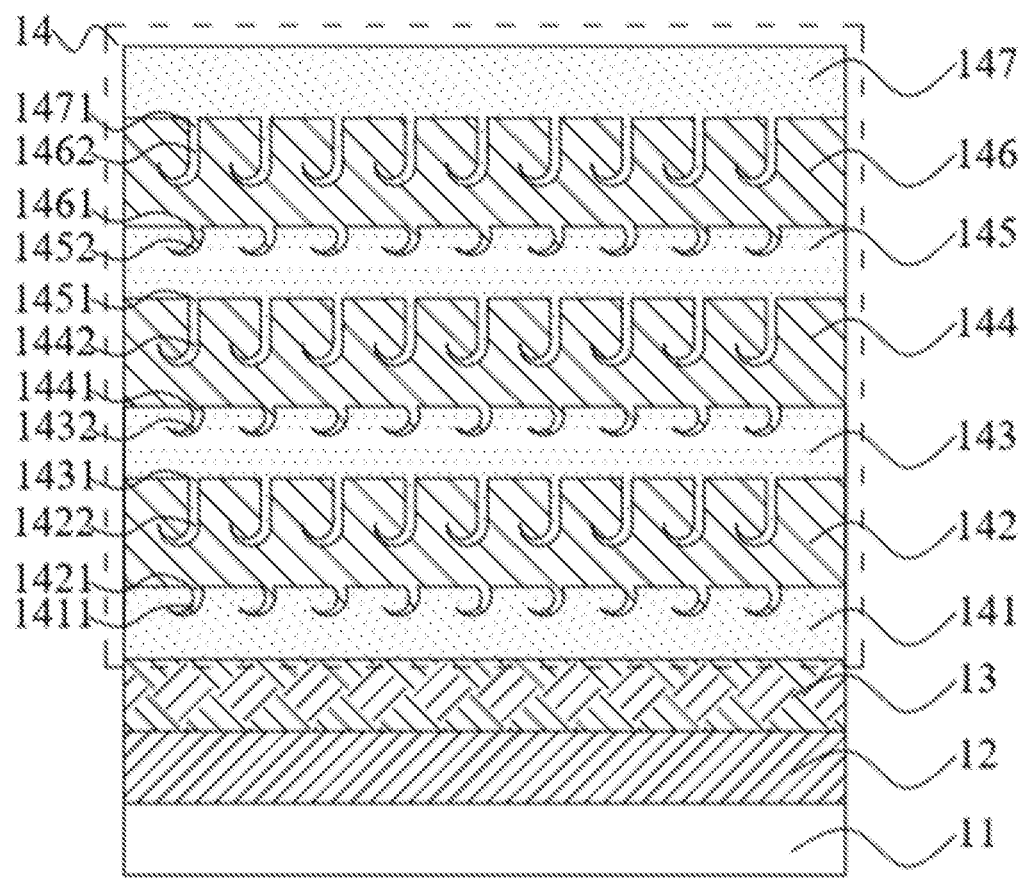
FIG. 4 is a schematic diagram of a third structure of an OLED display panel according to one embodiment of the present invention.
Figure 5:
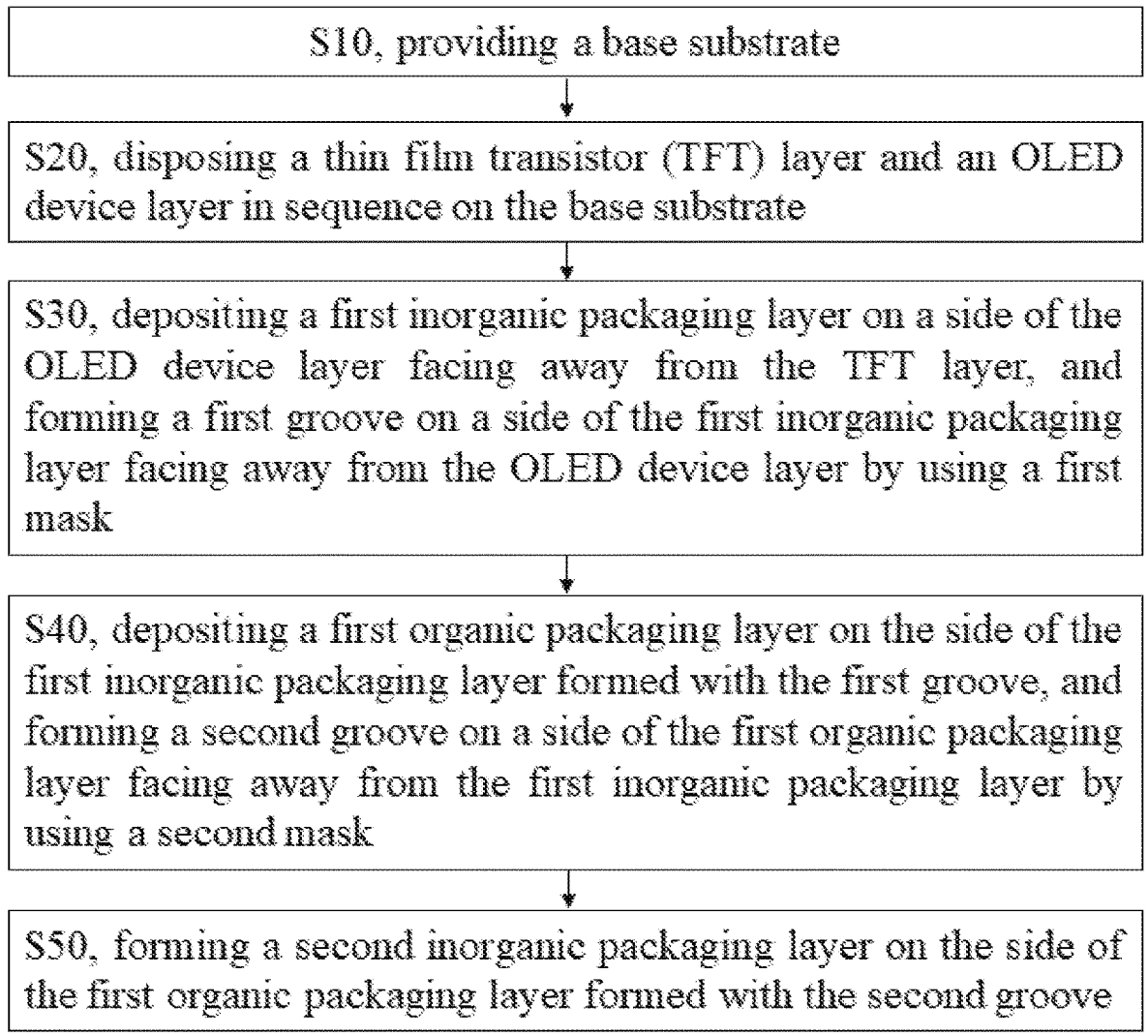
FIG. 5 is a schematic flowchart diagram of a method of manufacturing an OLED display panel according to one embodiment of the present invention.

Currently, a thin film packaging layer in the field of OLED display is generally an alternating structure of "inorganic packaging layer-organic packaging layer-inorganic packaging layer." When a bending or a lateral pressure is applied, a film layer between the inorganic packaging layer and the organic packaging layer is prone to peel and results in a packaging failure. Therefore, the present invention provides an OLED display panel and a method of manufacturing thereof to improve the phenomenon of the current thin film packaging layer that has poor stability, is prone to peeling, and cannot effectively prevent the erosion of the internal film from the external water, oxygen, impurities, and the like. First, a groove structure is formed between an organic packaging layer and an inorganic packaging layer of a thin film packaging layer, so that the peeling is not easy to occur between the organic packaging layer and the inorganic packaging layer when they are bent or subjected to the lateral pressure. Correspondingly, a first protrusion is formed on a side of a first organic packaging layer near a base substrate, and a second protrusion is formed on a side of a second inorganic packaging layer near the base substrate, a third protrusion is formed on a side of a second organic packaging layer near the base substrate, a fourth protrusion is formed on a side of a third inorganic packaging layer near the base substrate. The first protrusion cooperates with the first groove, the second protrusion cooperates with the second groove, the third protrusion cooperates with the third groove and the fourth protrusion cooperates with the fourth groove. Additionally, in order to further enhance the packaging effect of the thin film packaging layer of the OLED display panel, a plurality of sets of the thin film packaging layer may be provided, that is, not limited to the alternating structure of "first inorganic packaging layer-first organic packaging layer-second inorganic packaging layer" as shown in FIG. 3, it may also be "first inorganic packaging layer-first organic packaging layer-second inorganic packaging layer-second organic packaging layer-third inorganic packaging layer" or "first inorganic packaging layer-first organic packaging layer-second inorganic packaging layer-second organic packaging layer-third inorganic packaging layer-third organic packaging layer-fourth inorganic packaging layer" as shown in FIG. 1 and FIG. 4. The peeling risk of the thin film packaging layer of the OLED display panel is further reduced, and the bending ability of the OLED display panel is enhanced.

FIG. 1 is a schematic structural diagram of an OLED display panel according to one embodiment of the present invention. In one embodiment of the present invention, the OLED display panel includes a base substrate 11, a thin film transistor (TFT) layer 12, an OLED device layer 13 and a packaging layer 14. In one embodiment of the present invention, the base substrate 11 may be a rigid substrate, such as a glass substrate or a quartz substrate. Preferably, a flexible substrate, such as a resin substrate, may be an organic substrate such as a polyimide substrate, a polyamide substrate, a polycarbonate substrate, or a polyether sulfone substrate. In another embodiment of the present invention, the substrate 11 can also be obtained by coating a polyimide (PI) film on a clean glass substrate through coater and then subjecting it to a high temperature curing process. Since the PI film has excellent high and low temperature resistance, electrical insulation, adhesion, radiation resistance, and dielectric resistance, the base substrate produced thereby has a good flexibility.

The TFT layer 12 is disposed on a side of the base substrate 11 and is formed by chemical vapor deposition. The TFT layer 12 includes a gate layer and a source/drain layer. The TFT may be a top gate type or a bottom gate type TFT.

The OLED device layer 13 is disposed on a side of the TFT layer 12 away from the base substrate 11. The OLED device layer 13 includes a cathode layer, an anode layer, a light emitting layer, an electron injection layer, an electron transport layer, an electron hole injection layer, an electron hole transport layer, and a barrier layer. The material of the cathode layer adopts a material with a low work function, it can improve the efficiency of electron injection and reduce the Joule heat generated during operation of the OLED so as to improve device lifetime. The anode layer needs to inject electron holes into the OLED so that it is required to have a higher work function. Therefore, the material of anode layer is generally selected from the group consisting of ITO, IZO, Au, Pt, Si, and the like.

The packaging layer 14 includes a first inorganic packaging layer 141, a first organic packaging layer 142 and a second inorganic packaging layer 143. The first inorganic packaging layer 141 is disposed on a side of the OLED device layer 13 away from the TFT layer 12, and a side of the first inorganic packaging layer 141 away from the OLED device layer 13 is formed with a first groove 1411. The first groove 1411 is used to cooperate with a first protrusion 1421 formed on a side of the first organic packaging layer 142 near the base substrate 11 so as to enhance the adhesion and stability between the first inorganic packaging layer 141 and the first organic packaging layer 142.

The first organic packaging layer 142 is disposed on a side of the first inorganic packaging layer 141 away from the OLED device layer 13 and a second groove 1422 is formed on a side the first organic packaging layer 142 away from the first inorganic packaging layer 141. A second groove 1422 is formed on a side of the first organic packaging layer 142 away from the first inorganic packaging layer 141. The first protrusion 1421 is formed on the side of the first organic packaging layer 142 near the base substrate 11. The second groove 1422 cooperates with a second protrusion 1431 formed on a side of the second inorganic packaging layer 143 near the base substrate 11 so as to enhance the adhesion and stability between the first organic packaging layer 142 and the second inorganic packaging layer 143.

The second inorganic packaging layer 143 is disposed on a side of the first organic packaging layer 142 away from the first inorganic packaging layer 141. When the packaging layer 14 is not the last thin film packaging layer, a third groove 1432 is formed on a side of the second inorganic packaging layer 143 away from the first organic packaging layer 142. The third groove 1432 cooperates with a third protrusion 1511 formed on a side of a first inorganic packaging layer 151 of a next adjacent thin film packaging layer (i.e., the second thin film packaging layer 15) near the base substrate 11 so as to enhance the adhesion and stability between the first thin film packaging layer 14 and the second thin film packaging layer 15. The thickness of the first inorganic packaging layer 141 and the second inorganic packaging layer 143 are the same.

The packaging layer 14 further includes a second organic packaging layer 144 and a third inorganic packaging layer 145 disposed on the second inorganic packaging layer 143 in sequence. Wherein the third groove 1432 is formed on the side of the second inorganic packaging layer 143 in contact with the second organic packaging layer 144. A fourth groove 1442 is formed on a side of the second organic packaging layer 144 in contact with the third inorganic packaging layer 145. The first groove 1411 and the third groove 1432 are formed the same. The second groove 1422 and the fourth groove 1442 are formed to have the same shape.

The first groove 1411 is uniformly arranged on the side of the first inorganic packaging layer 141 in contact with the first organic packaging layer 142. The second groove 1422 is uniformly arranged on the side of the first organic packaging layer 142 in contact with the second inorganic packaging layer 143.

In one embodiment of the present invention, the first groove (1411, 1412) and the second groove (1422, 1522) have a certain predetermined depth, a predetermined length, and a predetermined spacing. The predetermined length of the first groove (1411, 1412) and the second groove (1422, 1522) is 5 to 10 μm, and the predetermined spacing is 10 to 20 μm. The predetermined depth of the first groove (1411, 1412) is 0 to 0.5 μm and the predetermined depth of the second groove (1422, 1522) is 0 to 1 μm. The shape of the first groove (1411, 1412) or the third groove 1432 is: rectangular, semi-circular, inverted triangle, trapezoidal, J-shaped or crescent-shaped, etc., not limited to the shape in the drawings of the present invention. Since the trapezoid is narrow to wide from top to bottom, and both the J-shape and the crescent shape have a certain arc angle, the adhesion and stability are stronger than the convention when subjected to the transverse shear stress. Therefore, the shape of the first groove (1411, 1412) and the second groove (1422, 1522) is preferably trapezoidal, J-shaped and crescent-shaped. The trapezoid may be isosceles trapezoid, right-angled trapezoid, isosceles right-angled trapezoid or asymmetric trapezoid. Meanwhile, for the convenience of preparation, when the shape of the first groove (1411, 1412) or the second groove (1422, 1522) is J-shaped or crescent-shaped, the groove has a certain predetermined angle. The predetermined angle of the groove is 0 degrees to 180 degrees.

Further, in one embodiment of the present invention, the first groove (1411, 1412) and the second groove (1422, 1522) may be formed by mask deposition. In another embodiment of the present invention, the first groove (1411, 1412) and the second groove (1422, 1522) may also be prepared through a photolithography technique including wet etching and dry etching. Wet etching is a technique of immersing an etching material in an etching solution for etching and it is a purification etching that has excellent selectivity and that will stop without damaging the film of the other layer of material below while the current thin file has been etched. Dry etching is a technique of performing plasma etching using plasma. When a gas exists in the form of a plasma, it has two characteristics, one is that the chemical activity of these gases in the plasma is much stronger than in the normal state, and depending on the material to be etched, the reaction with material can be proceeded faster if a suitable gas is selected so that the purpose of etching remove can be achieved. The other one is that the electric field can be used to guide and accelerate the plasma to have a certain energy, when it bombards the surface of the object to be etched, it will be etched. The atoms of the material are shot out to achieve the purpose of etching using physical energy transfer. In another embodiment of the present invention, the excess thin film of the first groove (1411, 1412) or the second groove (1422, 1522) may be removed by laser cutting.

Further, the predetermined thickness of the first inorganic packaging layer (141, 151) and the second inorganic packaging layer (143, 153) is 1 to 2 μm. The thickness of the first organic packaging layer (142, 152) is 6 to 12 μm. The first inorganic packaging layer (141, 151) and the second inorganic packaging layer (143, 153) are made of silicon nitride. The first organic packaging layer (142, 152) is made of polymethylmethacrylate.

Further, in order to cooperate with the grooves, the corresponding protrusions need to be formed in the first thin film packaging layer 14 and the second thin film packaging layer 15. Accordingly, the first protrusion (1421, 1521) that is formed on the side of the first organic packaging layer (142, 152) near the base substrate 11 and that is corresponding to the first groove (1411, 1412). The second protrusion (1431, 1531) is formed on the side of the second inorganic packaging layer (143, 153) near the base substrate 11 and is corresponded to the second groove (1422, 1522). The third protrusion 1511 is formed on the side of the second organic packaging layer 151 near the base substrate 11 and is corresponded to the third groove 1432. The fourth protrusion 1451 is formed on the side of the third inorganic packaging layer 145 near the base substrate 11 and is corresponded to the fourth groove 1442. Therefore, the shape and size of the first protrusion (1421, 1521) and the shape and size of the first groove (1411, 1432) are the same. The shape and size of the second protrusion (1431, 1531) and the shape and size of the second groove (1422, 1522) are the same.

In another embodiment of the present invention, in order to enhance the strength and toughness of the first inorganic packaging layer (141, 151) and the second inorganic packaging layer (143, 153), the first inorganic packaging layer (141, 151) and the second inorganic packaging layer (143, 153) are deposited with a certain amount of doped metal nanoparticles. The doped metal nanoparticles may be one or more of copper, aluminum, tantalum, magnesium, platinum, silver, and lead, which can prevent the crack from expanding and effectively improve the material embrittlement of the first inorganic packaging layer (141, 151) and the second inorganic packaging layer (143, 153) in the thin film packaging layer. Additionally, the metal nanoparticles have good thermal conductivity so that the heat dissipation performance of the OLED display panel can also be enhanced.

Referring to FIG. 2A to FIG. 2I and FIG. 5, the present invention further provides a method of manufacturing an OLED display panel. The specific steps of the method are: S10, providing a base substrate 11; S20, sequentially disposing a TFT layer 12 and an OLED device layer 13 on the base substrate 11; S30, depositing a first inorganic packaging layer 141 on a side of the OLED device layer 13 away from the TFT layer 12, and forming a first groove 1411 on a side of the first inorganic packaging layer 141 away from the OLED device layer 13 by using a first mask; S40, depositing a first organic packaging layer 142 on a side of the first inorganic packaging layer 141 formed with the first groove 1411, and forming a second groove 1422 on a side of the first organic packaging layer 142 away from the first inorganic packaging layer 141 by using a second mask; S50, disposing a second inorganic packaging layer 143 on a side of the first organic packaging layer 142 formed with the second groove 1422. The method further includes: S60, forming a third groove 1432 on a side of the second inorganic packaging layer 143 away from the first organic packaging layer 142 by using the first mask; S70, depositing a second organic packaging layer 144 on a side of the second inorganic packaging layer 143 formed with the third groove 1432, and forming a fourth groove 1442 on a side of the second organic packaging layer 144 away from the second inorganic packaging layer 143 by using the second mask; S80, forming a third inorganic packaging layer 145 on a side of the second organic packaging layer 144 formed with the fourth groove 1442.

In the preparation of the thin film packaging layer, the macromolecular organic material is generally formed by inkjet printing, and the small molecular organic material is generally deposited by vapor deposition.

Therefore, the OLED display panel provided by the present invention and the preparation method thereof have the following beneficial effects. First, the OLED display panel provided by the present invention has a groove structure formed in the thin film packaging layer, thereby improving the adhesion and stability of the inorganic packaging layer and the organic packaging layer, and the display panel is not easily peeling when bent or subjected to lateral pressure, and it provides a better protection to prevent the inner film layer from the damage caused by external water, oxygen, impurities, and the like, and the quality of the display panel is improved. Second, the groove is divided into the first groove and the second groove according to the different thickness between the inorganic packaging layer and the organic packaging layer. The first groove and the second groove have a certain difference in the depth that further improves the stability of the thin film package layer. Then, in order to fix of the groove, the first protrusion and the second protrusion are formed on the side of the first organic packaging layer and on the side of the second inorganic packaging layer near the base substrate, respectively. Finally, the OLED display panel provided by the present invention has a packaging layer with the structure of: "first inorganic packaging layer-first organic packaging layer-second inorganic packing layer," "first inorganic packaging layer-first organic packaging layer-second inorganic packaging layer-second organic packaging layer-third inorganic packaging layer," or "first inorganic packaging layer-first organic packaging layer-second inorganic packaging layer-second organic packaging layer-third inorganic packaging layer-third organic packaging layer-fourth inorganic packaging layer," which is constructed with multi-layer packaging structure, which further reduces the risk of peeling in the thin film packaging layer of the OLED display panel.

An OLED display panel and a method of manufacturing the same provided by the embodiments of the present invention have been described in detail. The principles and embodiments of the present invention are described in the specific examples. The description of the above embodiments is only used to understand the technical solution and main idea of the present invention. Those of ordinary skill in the art should understand that it can still modify the technical solutions described in the foregoing embodiments, or replace some of the technical features, and these modifications or replacements do not make the essence of the corresponding technical solutions depart from the scope of the technical solutions of the embodiments of the present invention.

What is claimed is:

1. An organic light emitting diode (OLED) display panel, comprising: a base substrate, a thin film transistor (TFT) layer, an OLED device layer and a packaging layer sequentially disposed; wherein the packaging layer comprises a first inorganic packaging layer, a first organic packaging layer, and a second inorganic packaging layer sequentially disposed; wherein the first inorganic packaging layer is provided with a first groove on a side in contact with the first organic packaging layer; wherein the first organic packaging layer is provided with a second groove on a side in contact with the second inorganic packaging layer; wherein a thickness of the first inorganic packaging layer is same as a thickness of the second inorganic packaging layer; wherein a predetermined length of the first groove and the second groove is 5 to 10 μm, and a predetermined distance of each first groove and each second groove is 10 to 20 μm; a predetermined depth of the first groove is 0 to 0.5 μm, a predetermined depth of the second groove is 0 to 1 μm.

2. The OLED display panel according to claim 1, wherein the packaging layer further comprises a second organic packaging layer and a third inorganic packaging layer sequentially disposed on the second inorganic packaging layer; wherein the second inorganic packaging layer is provided with a third groove on a side in contact with the second organic packaging layer; wherein the second organic packaging layer is provided with a fourth groove on a side in contact with the third inorganic packaging layer.

3. The OLED display panel according to claim 2, wherein the first groove and the third groove have a same shape, and the second groove and the fourth groove have a same shape.

4. The OLED display panel according to claim 1, wherein the first groove is uniformly disposed as an array on the side of the first inorganic packaging layer that in contact with the first organic packaging layer; the second groove is uniformly disposed as an array on the side of the first organic packaging layer in contact with the second inorganic packaging layer.

5. The OLED display panel according to claim 1, wherein a shape of the first groove and the second groove is one of a rectangle, a semicircle, an inverted triangle, a trapezoid, a J shape or a crescent shape, or a combination thereof.

6. The OLED display panel according to claim 1, wherein a predetermined thickness of the first inorganic packaging layer and the second inorganic packaging layer is 1 to 2 μm; a predetermined thickness of the first organic packaging layer is 6 to 12 μm.

7. The OLED display panel according to claim 1, wherein the first inorganic packaging layer and the second inorganic packaging layer are made from silicon nitride, and the first organic packaging layer is made of polymethylmethacrylate.

8. The OLED display panel according to claim 1, wherein the base substrate is a rigid substrate, a flexible substrate, or is coated on a glass substrate by polyimide coating.

9. The OLED display panel according to claim 1, wherein the TFT layer is a top gate TFT or a bottom gate TFT.

10. An organic light emitting diode (OLED) display panel comprising: a base substrate, a TFT layer, an OLED device layer and a packaging layer sequentially disposed; wherein the packaging layer comprises a first inorganic packaging layer, a first organic packaging layer and a second inorganic packaging layer sequentially disposed; wherein the first inorganic packaging layer is provided with a first groove on a side in contact with the first organic packaging layer; wherein the first organic packaging layer is provided with a second groove on a side in contact with the second inorganic packaging layer; wherein a predetermined length of the first groove and the second groove is 5 to 10 μm, and a predetermined distance of each first groove and each second groove is 10 to 20 μm; a predetermined depth of the first groove is 0 to 0.5 μm, a predetermined depth of the second groove is 0 to 1 μm.

11. The OLED display panel according to claim 10, wherein the packaging layer further comprises a second organic packaging layer and a third inorganic packaging layer sequentially disposed on the second inorganic packaging layer; wherein the second inorganic packaging layer is provided with a second groove on a side in contact with the second organic packaging layer; wherein the second organic packaging layer is provided with a fourth groove on a side in contact with the third inorganic packaging layer.

12. The OLED display panel according to claim 11, wherein the first groove and the third groove are disposed the same, the second groove and the fourth groove are disposed the same.

13. The OLED display panel according to claim 10, wherein the first groove is uniformly disposed as an array on the side of the first inorganic packaging layer that in contact with the first organic packaging layer; the second groove is uniformly disposed as an array on the side of the first organic packaging layer in contact with the second inorganic packaging layer.

* * * * *